(12) United States Patent
Shim

(10) Patent No.: US 7,843,756 B2
(45) Date of Patent: Nov. 30, 2010

(54) LOW CURRENT CONSUMPTION SEMICONDUCTOR MEMORY DEVICE HAVING INPUT/OUTPUT CONTROL CIRCUIT AND CONTROL METHOD THEREOF

(75) Inventor: Young Bo Shim, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 161 days.

(21) Appl. No.: 12/141,250

(22) Filed: Jun. 18, 2008

(65) Prior Publication Data
US 2009/0168588 A1 Jul. 2, 2009

(30) Foreign Application Priority Data
Jan. 2, 2008 (KR) .................. 10-2008-0000291

(51) Int. Cl.
*G11C 8/00* (2006.01)
(52) U.S. Cl. .................. 365/230.03; 365/230.01; 365/230.06; 365/230.08
(58) Field of Classification Search ........... 365/230.03, 365/230.01, 230.06, 230.08
See application file for complete search history.

(56) References Cited

U.S. PATENT DOCUMENTS

| | | | | | |
|---|---|---|---|---|---|
| 5,091,883 | A | * | 2/1992 | Matsuzaki et al. | 365/189.05 |
| 7,286,416 | B2 | * | 10/2007 | Ooishi et al. | 365/189.05 |
| 2002/0181315 | A1 | * | 12/2002 | Lee et al. | 365/230.06 |
| 2003/0002316 | A1 | * | 1/2003 | Morita et al. | 365/63 |
| 2007/0180006 | A1 | * | 8/2007 | Gyoten et al. | 708/200 |

FOREIGN PATENT DOCUMENTS

| KR | 1020050034383 A | 4/2005 |
|---|---|---|
| KR | 1020080062097 A | 7/2008 |

* cited by examiner

*Primary Examiner*—Thong Q Le
(74) *Attorney, Agent, or Firm*—Ladas & Parry

(57) ABSTRACT

A low-current consumption semiconductor memory device includes a plurality of cell blocks, in which each cell block includes a plurality of cell mats; a plurality of input/output line switches which transmit the plurality of cell blocks to input/output lines; and an input/output line control circuit which receives a block address indicating arbitrary blocks among the plurality of cell blocks and an active command to control a drive of an input/output line switch according to an input level of the block address.

32 Claims, 4 Drawing Sheets

US 7,843,756 B2

LOW CURRENT CONSUMPTION SEMICONDUCTOR MEMORY DEVICE HAVING INPUT/OUTPUT CONTROL CIRCUIT AND CONTROL METHOD THEREOF

CROSS-REFERENCE TO RELATED APPLICATIONS

The present application claims priority to Korean patent application number 10-2008-0000291 filed on Jan. 2, 2008, which is incorporated herein by reference in its entirety.

BACKGROUND OF THE INVENTION

The present invention relates to a semiconductor memory device, and more particularly, to a low-current consumption semiconductor memory device having an input/output control circuit and a control method thereof.

Recently a number of studies have been undertaken to study different ways to obtain and to design low-current consumption semiconductor memory integrated circuits. Even though high-speed operation and high-level of integration are regarded as being highly desirable low-current consumption is also a desirable feature. Especially, this low-current consumption feature is very desirable in cases where the semiconductor memory device is used as a mobile component.

To reduce or minimize operating currents during active and precharge operations of a semiconductor memory device, it is very important to reduce current consumption during an input/output operations.

In this regard, FIG. 1 depicts a cell block diagram illustrating a typical semiconductor memory device. Here, the 'S/A' represents a sense amplifier, the 'Cell Mat' denotes a cell matrix, the 'SWLD' denotes a sub-wordline driver, the 'S/H' denotes a sub-hole, the 'BISH' and 'BISL' represent a bit line selection signal, the S/A Ctrl' denotes a sense amplifier controller, the 'Blk Ctrl' denotes a block controller, and the 'IOSW' denotes an input/output switching signal.

FIG. 2 is a circuit diagram illustrating an input/output switch of a typical sub-hole. Furthermore, FIG. 3 is a circuit diagram illustrating a conventional input/output control circuit which controls input/output switch of FIG. 2.

When an arbitrary block address (for instance, block "1") and an active command are received from the outside, an IOSW signal, which is a connecting transistor control signal between a local input/output line LIO/LIOb and a sub-input/output line SIO/SIOb to connect between a bit line sense amplifier BLSA and an input/output sense amplifier IOSA in the relevant cell block, is transitioned to a high level, thereby connecting a path between the bit line sense amplifier BLSA and the input/output sense amplifier IOSA, i.e., LIO/LIOb & SIO/SIOb, to each other.

In addition, when a precharge command is received, the bit line sense amplifier BLSA is precharged to a bit line precharge voltage VBLP and an IOSW signal, which is a local input/output line LIO/LIOb & sub-input/output line SIO/SIOb data line connecting transistor control signal, is transited to a logically low level, thereby blocking a path between the bit line sense amplifier BLSA and the input/output sense amplifier IOSA, i.e., a path (LIO/LIOb & SIO/SIOb).

As described above, whenever an active and precharge command is received, an input/output control signal IOSW is changed from the boosted voltage VPP to the ground voltage VSS, or from the ground voltage VSS level to the boosted voltage VPP, thereby generating a switching current consumption. For current consumption at a boosted voltage VPP stage, because the boosted voltage VPP is generated by pumping a supply voltage VDD with a VPP pump, pumping current of the VPP pump is also consumed, thereby further increasing current consumption on the whole.

The VPP pump efficiency is typically 25-30%, and thus overall current consumption becomes 3 to 4 times larger than the switching current of the input/output control signal IOSW.

However, according to an input/output control circuit having a structure shown in FIGS. 2 and 3, when an active & precharge command is received, regardless of the position of each cell array block shown in FIG. 1, it becomes a structure that the input/output control signal IOSW is unconditionally toggled. In that event, however, a large amount of current is consumed due to a toggle of the input/output control signal IOSW, and as a result low-current consumption operation cannot be achieved.

SUMMARY OF THE INVENTION

The present invention provides an input/output control circuit and a control method thereof which can be used to realize a low-current consumption of a semiconductor memory device.

Also the present invention provides an input/output control circuit and a control method thereof in which an input/output control is different according to an active and precharge condition, thereby realizing a low-current consumption as compared to other input/output control circuits.

Further the present invention provides an input/output control circuit and a control method thereof in which an input/output control is different in accordance to a cell array block condition.

Still further the present invention provides an input/output control circuit and a control method thereof in which a toggle of an input/output switch is controlled, thereby making it possible to realize a low-current consumption.

The present invention comprises a plurality of cell blocks, each of which includes a plurality of cell mats (i.e., matrixes), a plurality of input/output line switches which transmit the plurality of cell blocks to input/output lines, and an input/output line control circuit which receives a block address indicating arbitrary blocks among the plurality of cell blocks and an active command to control a drive of an input/output line switch according to an input level of the block address.

The input/output line control circuit is characterized by comprising a block address input unit which receives first and second block addresses, a decoding unit which decodes each output signal of an active command and the block address input unit, a driving unit which drives an output signal of the decoding unit, a latch unit which latches an output signal of the driving unit, and an output unit which receives an output of the latch unit to generate an input/output control signal. For each of the plurality of cell mats, it is characterized by having a sub-hole.

Preferably, the input/output line switch is formed in the sub-hole.

The input/output line switch is characterized by maintaining the previous state in response to an output of the input/output line control circuit when another cell block is selected which is the same as a previously accessed cell block.

The input/output line switch is characterized as maintaining the previous state in response to an output of the input/output line control circuit when a block adjacent to a previously accessed block is selected.

The input/output line switch is characterized as being driven at a disable state in response to an output of the input/ output line control circuit when a block located more than two blocks away from a previously accessed block is selected.

Furthermore the present invention of low-current consumption semiconductor memory device comprises a plurality of cell blocks, each block includes a plurality of cell mats; and an input/output line control circuit which receives a block address indicating arbitrary blocks among the plurality of cell blocks and an active command to control a drive of an input/output line switch in which input/output line switch connects the plurality of cell blocks in accordance to an input level of the block address.

The input/output line control circuit is characterized by comprising a block address input unit which receives first and second block addresses; a decoding unit which decodes an active command and an output signal of the block address input unit; a driving unit which drives an output of the decoding unit; a latch unit which latches an output signal of the decoding unit; and an output unit which receives an output from the latch unit which generates an input/output control signal.

For each cell mat of the plurality of cell mats is characterized by having a sub-hole.

Preferably, the input/output line switch is formed in the sub-hole. The input/output line switch is characterized by maintaining the previous state in response to an output of the input/output line control circuit when another block is selected which is the same as a previously accessed block.

The input/output line switch is characterized by maintaining the previous state in response to an output of the input/output line control circuit when a block adjacent to a previously accessed block is selected.

The input/output line switch is characterized by being driven at a disable state in response to an output of the input/output line control circuit when a block located more than two blocks away from a previously accessed block is selected.

Furthermore, the input/output line control circuit of the present invention comprising a block address input unit which receives first and second block addresses; a decoding unit which decodes an active command and an output signal of the block address input unit; a driving unit which drives an output of the decoding unit; a latch unit which latches an output signal of the driving unit; and an output unit which receives an output of the latch unit to generate an input/output control signal.

The input/output line control circuit controls a drive of an input/output line switch, which is a switch of connecting a plurality of cell blocks including a plurality of cell mats.

The input/output line switch is characterized by maintaining the previous state in response to an output of the input/output line control circuit when another block which is the same as a previously accessed block is selected.

The input/output line switch is characterized by maintaining the previous state in response to an output of the input/output line control circuit when a block adjacent to a previously accessed block is selected.

The input/output line switch is characterized by being driven at a disable state in response to an output of the input/output line control circuit when a block located more than two blocks away from a previously accessed block is selected.

The previous state is characterized by being a state that a toggle of the input/output line switch does not occurs.

Furthermore, the input/output line control method of the semiconductor memory device according to the present invention is characterized by comprising a block address input process of receiving a first and a second block addresses; an active command input process of receiving an active command; a decoding process of decoding each output signal of the block address input unit and active command input unit; a latch process of latching an output signal of the decoding unit; and an output process of receiving an output of the latch unit to generate an input/output control signal, wherein an output level of the input/output line control signal maintains the previous state when another block which is the same as a previously accessed block is selected.

The input/output line control signal is a signal that controls a drive of an input/output line switch and which is a means of connecting a plurality of cell mats. The input/output line switch is characterized in that a toggle does not occur in response to an output level of the input/output line control signal when another block is selected which is the same as a previously accessed block is selected. Preferably, the input/output line switch is arranged in a sub-hole region formed in an adjacent region of the plurality of cell mats.

Furthermore, an input/output line control method of a semiconductor memory device according to the present invention is characterized by comprising a block address input process for receiving a first and a second block addresses; an active command input process for receiving an active command; a decoding process for decoding each output signal of the block address input unit and active command input unit; a latch process for latching an output signal of the decoding unit; and an output process for receiving an output of the latch unit for generating an input/output control signal, wherein an output level of the input/output line control signal maintains the previous state when a block adjacent to a previously accessed block is selected.

The input/output line control signal is a signal that controls a drive of an input/output line switch, which is a means for connecting a plurality of cell mats.

The input/output line switch is characterized in that a toggle does not occurs in response to an output level of the input/output line control signal when another block is selected which is the same as a previously accessed block.

Preferably, the input/output line switch is arranged in a sub-hole region formed in an adjacent region of the plurality of cell mats.

Furthermore, an input/output line control method of a semiconductor memory device according to the present invention is characterized by comprising a block address input process of receiving a first and a second block addresses; an active command input process of receiving an active command; a decoding process of decoding each output signal of the block address input unit and active command input unit; a latch process of latching an output signal of the decoding unit; and an output process of receiving an output of the latch unit to generate an input/output control signal, wherein an output level of the input/output line control signal is disabled when a block located more than two blocks away from a previously accessed block is selected.

The input/output line control circuit is a signal that controls a drive of an input/output line switch, which is a means of connecting a plurality of cell mats.

It is characterized in that the input/output line switch is disabled in response to an output level of the input/output line control signal when another block is selected which is the same as a previously accessed block.

Preferably, the input/output line switch is arranged in a sub-hole region formed in an adjacent region of the plurality of cell mats.

According to the present invention, when a same or an adjacent block is sequentially accessed, an IOSW signal of the relevant block is not toggled by an active and precharge command and continues to maintain the previous state so that a toggle current of the IOSW can be reduced, thereby providing a suitable effect in realizing a low-current consumption operation.

DESCRIPTION OF SPECIFIC EMBODIMENTS

Hereinafter, preferred embodiments of the present invention will be described in detail with reference to the accompanying drawings.

Figure 1:
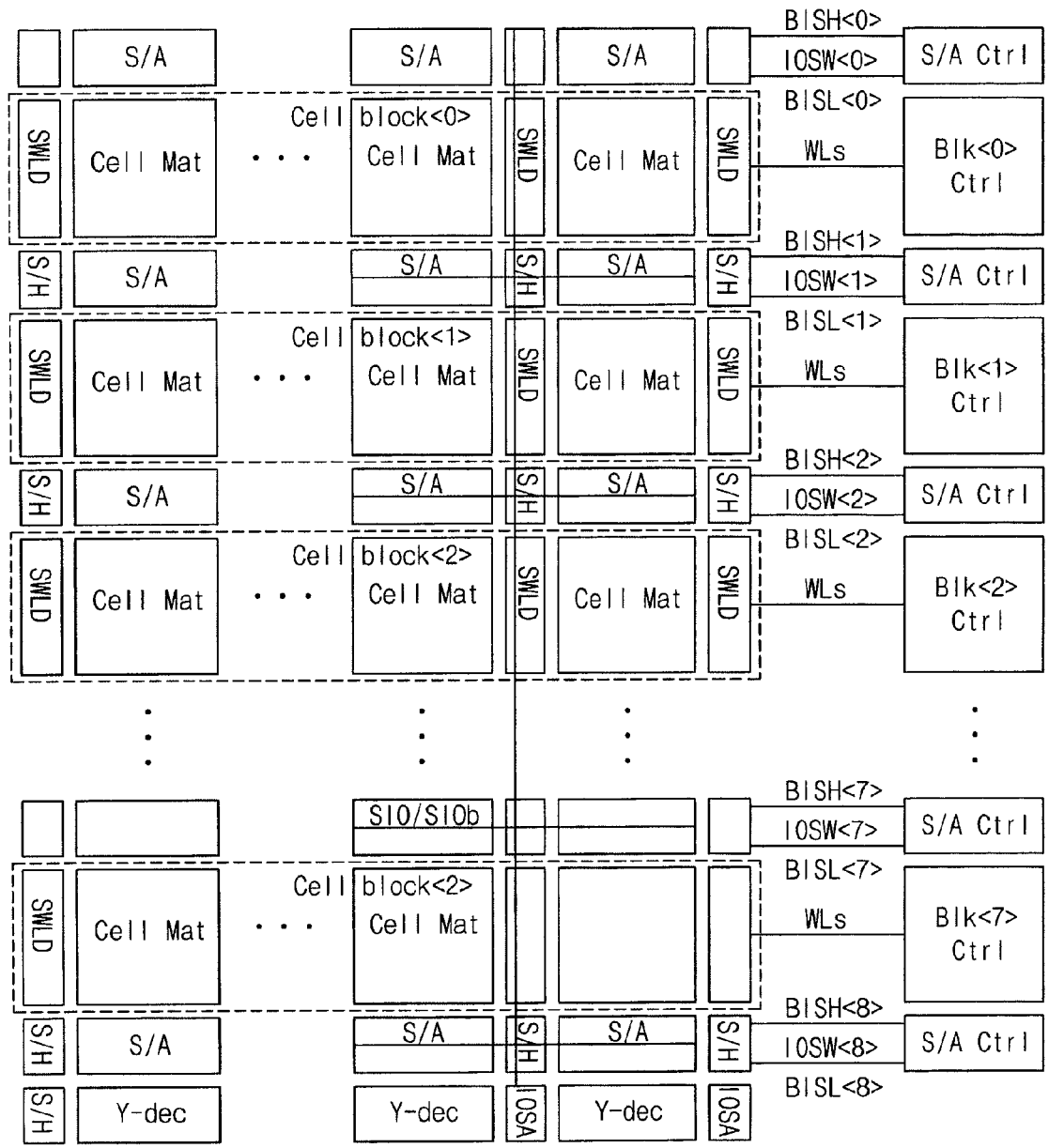
FIG. 1 is a cell block diagram illustrating a typical semiconductor memory device.
Figure 2:
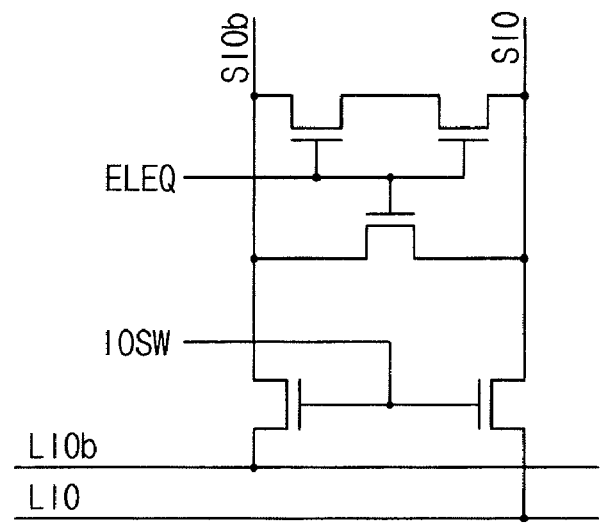
FIG. 2 is a circuit diagram illustrating an input/output switch of FIG. 1.
Figure 3:
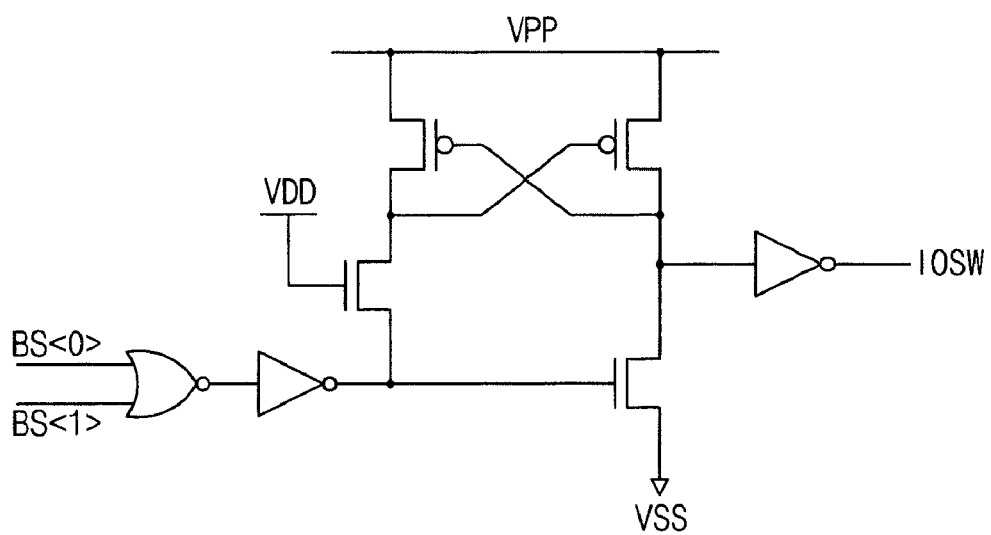
FIG. 3 is a circuit diagram illustrating a conventional input/output control circuit according to a structure of FIG. 2.
Figure 4:
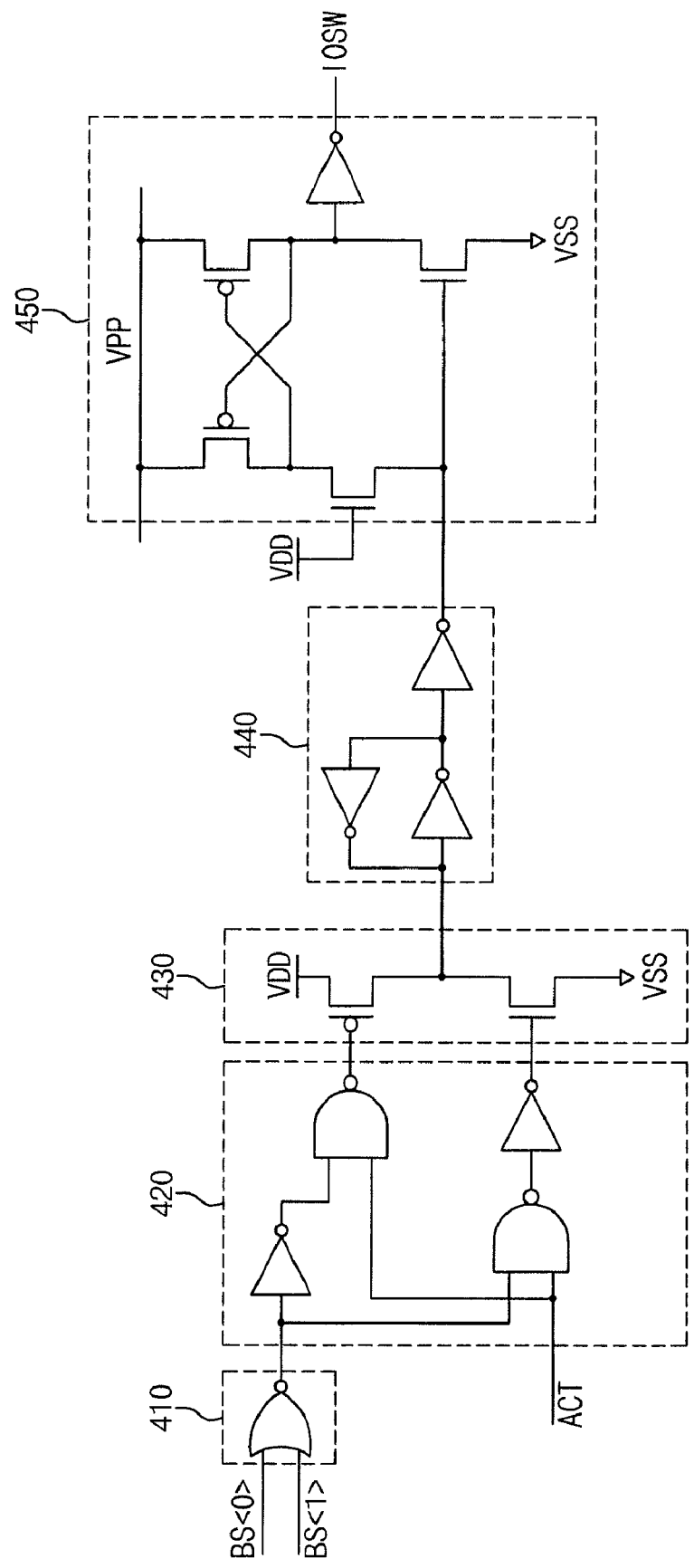
FIG. 4 is a circuit diagram illustrating an input/output control circuit according to the present invention.

FIG. 4 is a circuit diagram illustrating an embodiment of an input/output control circuit according to the present invention. As a feature of a structure according to the present invention, operational conditions for controlling an input/output control signal IOSW can be divided into 3 cases: (1) when another block is sequentially selected which is the same as a previously selected block; (2) when another block is selected which is adjacent to a previously selected block; (3) when another block is selected which is located more than two blocks away from a previously selected block.

Prior to explanation of an operation thereof, the definitions of related terminologies are as follows.

1) BS denotes an internal block selection address bar signal that is generated for selecting a cell mat when a block [cell mat] address and an active command are simultaneously received from the outside.

2) CLK refers to an external clock. It denotes a reference clock in such a manner that every command is received in synchronization with a rising edge of this clock, and also internal signals in a semiconductor memory device are synchronized with this clock.

3) WL refers to a word line signal that is activated when a block [cell mat] address and an active command are simultaneously received from the outside to select a cell mat. It functions to control a cell transistor for managing an input/output of cell data.

4) BLEQ denotes a bit line equalizer, and functions to charge a bit line and a sense amplifier to a level of bit line precharge voltage VBLP when an external precharge command is received.

5) BISH, BISL refer to a signal to control a bit line isolation transistor located between a bit line B/L and a sense amplifier S/A in a cell mat. The BISH (Bit Line Isolation High) controls a bit line isolation transistor connected to a B/L of the sense amplifier upper cell mat. The BISL (Bit Line Isolation Low) controls a bit line isolation transistor connected to a B/L of the sense amplifier lower cell mat. At an idle state, both maintain a logically high level, and when an active command is received, a bit line isolation transistor control signal at a selected cell mat side continues to maintain a logically high state, and a bit line isolation transistor control signal at a non-selected cell mat side is transitioned to a logically low state, thereby turning off the bit line isolation transistor. Subsequently, when a precharge command is received, the bit line isolation transistor control signal at a non-selected cell mat side, which has maintained a logically low state, is transitioned to a logically high level, and thereby functioning to turn on the bit line isolation transistor.

6) BLSA refers to a bit line sense amplifier, and it is located between cell mats, thereby functioning to amplify a level charged at a bit line.

7) S/H refers to a place where there are repeaters of a signal coming from a bit line sense amplifier control block (BLSA Ctrl block) and an IOSW transistor of connecting a local input/output line LIO/LIOb to a sub-input/output line SIO/SIOb, to control a bit line sense amplifiers BLSA and a transistor of connecting a local input/output line LIO/LIOb to a sub-input/output line SIO/SIOb, and is an abbreviation of "sub-hole."

8) IOSW is located in a sub-hole S/H region, and denotes an IOSW transistor control signal to manage a connection of LIO/LIOb and SIO/SIOb lines for a data input/output between a bit line sense amplifier BLSA and an input/output line sense amplifier IOSA, and is an abbreviation of "input/output switch".

9) SIO/SIOb is named for a data line of connecting a bit line sense amplifier BLSA to an IOSW transistor, and is an abbreviation of "segment input/output."

10) LIO/LIOb is named for a data line of connecting an IOSW transistor to an IOSA, and is an abbreviation of "local input/output."

11) Act is an abbreviation of "active," and when a block [cell mat] address and an active command are simultaneously received from the outside, it is changed from a logically low level to a logically high level, and when a precharge command is received, it is changed from a logically high level to a logically low level, thereby functioning to activating a cell mat.

12) IOSW Transistor denotes a transistor for managing a connection between a segment input/output line SIO/SIOb and a local input/output line LIO/LIOb, and is located in a sub-hole S/H region.

As stated above, the definitions of related terminologies are explained, and an active & precharge process according to the present invention will be described in detail.

FIG. 4 is a circuit diagram illustrating an embodiment of an input/output control circuit according to the present invention. The structure includes a block address input unit 410 which receives first and second block addresses, a decoding unit 420 which decodes an active command and an output signal of the block address input unit 410, a driving unit 430 which is driven by an output signal of the decoding unit 420, a latch unit 440 which latches an output signal of the driving unit 430, and an output unit 450 which receives an output of the latch unit 440 to generate an input/output control signal IOSW.

A block selecting operation according to a structure of FIG. 4 will be described in detail.

Prior to the operation, an IOSW signal is also initialized to a low level through a memory initialization process. After initialization, when an address (e.g. block "0") and an active command are received, a BS<0> signal of FIG. 4 is changed from a logically low level to a logically high level, and at the same time an active command Act signal is changed from a logically low level to a logically high level. Then, due to a circuit characteristic, an IOSW signal is also changed from a logically low level to a logically high level, thereby turning on an IOSW transistor located in the sub-hole S/H. As a result, a segment input/output line SIO/SIOb is connected to a sub-input/output line LIO/LIOb signal.

Figure 5:
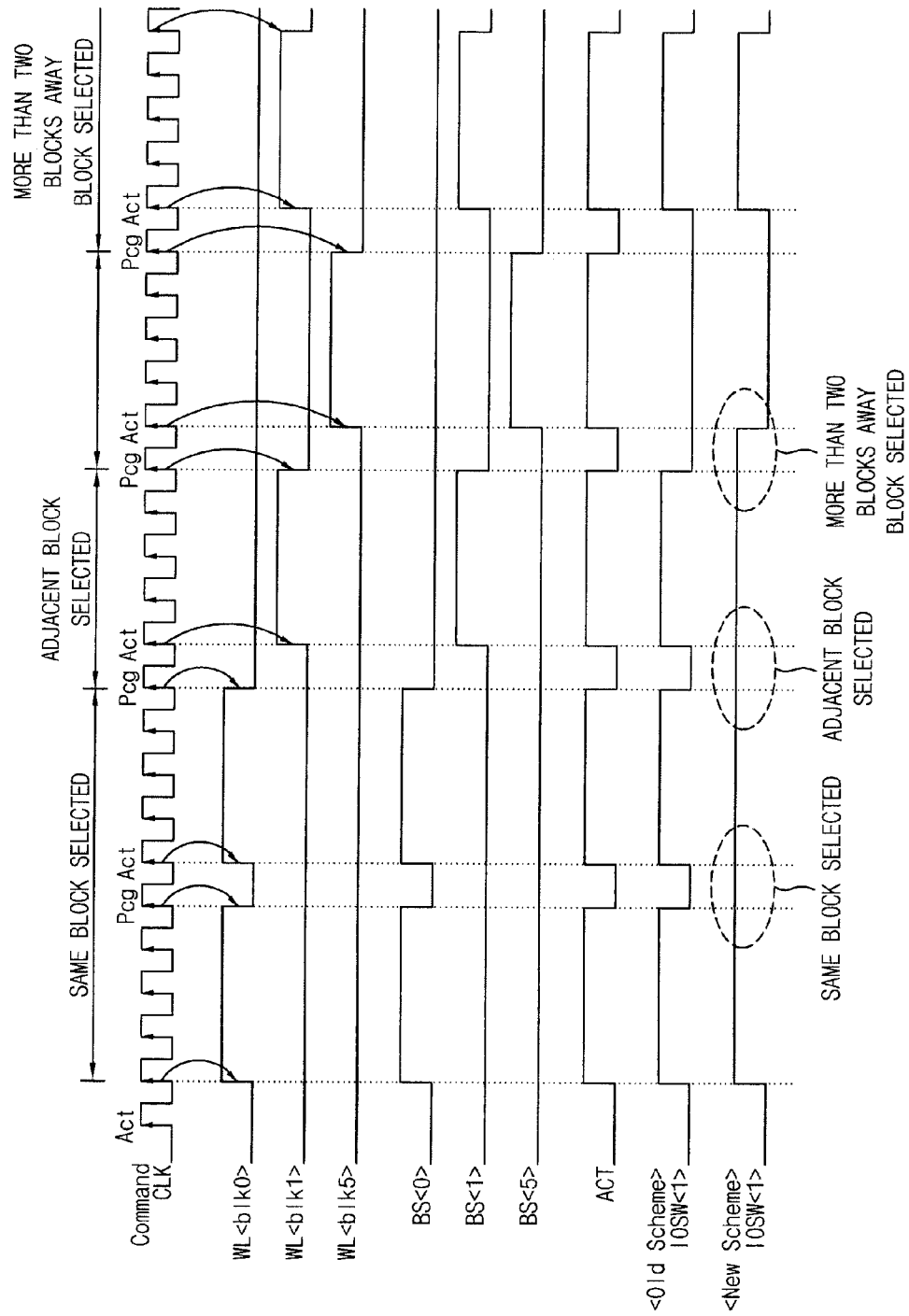
FIG. 5 is an operational waveform diagram according to a structure of FIGS. 3 and 4.

Subsequently, when a precharge command is received, the BS<0> that have been in a logically high state is changed to a logically low level, and at the same time an active command Act signal is changed from a logically high level to a logically low level. Then, due to an IOSW control circuit characteristic, an output signal IOSW is not changed, and then as shown in FIG. 5, a type of block address being received at the next active command will determine whether it is changed or not.

First, there will be described a case of same block active operation. After precharge, when a block address which is the same as a previously accessed block "0" and an active command is received, a BS<0> signal of FIG. 4 is changed from a logically low level to a logically high level, and at the same time an active command Act signal is changed from a logically low level to a logically high level. Then, an IOSW signal also continues to maintain a previous logically high level, thereby an IOSW transistor located in the sub-hole S/H continuing to be in an "ON" state, and as a result a SIO/SIOb and LIO/LIOb data line continues to be in a connecting state.

Subsequently, when a precharge command is received, the BS<0> that had been in a logically high state is changed to low level, and at the same time an Act signal is changed from high level to low level. Then, due to an IOSW control circuit characteristic, an output signal IOSW is not changed, and then as shown in FIG. 5, a type of block address being received at the next active command will determine whether it is changed or not.

Next, there will be described a case of adjacent block active operation. After precharge, when a block "1" address adjacent to a previously accessed block "0" and an active command are received, a BS<0> signal of FIG. 4 maintains a low state, and BS<1> is changed from low level to high level, and at the same time an Act signal is changed from low level to high level. Then, an IOSW signal also continues to maintain a previous high state, thereby an IOSW transistor located in the sub-hole S/H continuing to be in an "ON" state, and as a result a SIO/SIOb and LIO/LIOb data line continues to be in a connecting state. Similarly, as described above, a state of IOSW is not changed by a precharge command.

Next, there will be described a case of more than two blocks away block active operation. When a block "5" address located more than two blocks away from the previously accessed block "1" and an active command are received, a BS<0, 1> signal of FIG. 4 maintains a low state, and an Act signal is changed from low level to high level. Then, due to an IOSW control circuit characteristic, an IOSW control signal is changed from high level to low level. Then, an IOSW transistor located in the sub-hole S/H is in an "OFF" state, and as a result a SIO/SIOb and LIO/LIOb data line is disconnected.

As aforesaid, an operation by an active and precharge command has been described.

As described above, when the same or an adjacent block is sequentially accessed, an IOSW signal is not toggled, thereby reducing a switching current component of an IOSW.

What is claimed is:

1. A semiconductor memory device, comprising:
    a plurality of cell blocks, each cell block includes a plurality of cell mats;
    a plurality of input/output line switches which transmit the plurality of cell blocks to input/output lines; and
    an input/output line control circuit which receives a cell block address corresponding to at least two adjacent blocks from among the plurality of cell blocks and an active command to control a drive of the input/output line switch in accordance to an input level of the cell block address.

2. The semiconductor memory device as set forth in claim 1, wherein the input/output line control circuit comprises:
    a block address input unit which receives a first cell block address and a second cell block address;
    a decoding unit which decodes an active command and an output signal of the block address input unit;
    a driving unit which is driven by an output of the decoding unit;
    a latch unit which latches an output signal of the driving unit; and
    an output unit which receives an output of the latch unit to generate an input/output control signal.

3. The semiconductor memory device as set forth in claim 2, wherein the plurality of cell mats, each cell mat having a sub-hole.

4. The semiconductor memory device as set forth in claim 3, wherein the input/output line switch is formed in the sub-hole.

5. The semiconductor memory device as set forth in claim 2, wherein the input/output line switch maintains the previous state in response to an output of the input/output line control circuit when another cell block is selected which is the same as a previously accessed cell block.

6. The semiconductor memory device as set forth in claim 2, wherein the input/output line switch maintains the a previous state in response to an output of the input/output line control circuit when another cell block is selected which is adjacent to a previously accessed cell block.

7. The semiconductor memory device as set forth in claim 2, wherein the input/output line switch is driven at a disable state in response to an output of the input/output line control circuit when another cell block is selected which is located more than two blocks away from a previously accessed cell block.

8. A semiconductor memory device, comprising:
    a plurality of cell blocks, each cell block includes a plurality of cell mats; and
    an input/output line control circuit which receives a cell block address corresponding to at least two adjacent blocks from among the plurality of cell blocks and receives an active command to control a drive of an input/output line switch, which is a connection switch for each of the cell blocks, in accordance to an input level of the cell block address.

9. The semiconductor memory device as set forth in claim 8, wherein the input/output line control circuit comprises:
    a block address input unit which receives a first cell block address and a second cell block address;
    a decoding unit which decodes an active command and an output signal of the block address input unit;
    a driving unit which drives an output of the decoding unit;
    a latch unit which latches an output signal of the decoding unit; and
    an output unit which receives an output of the latch unit to generate an input/output control signal.

10. The semiconductor memory device as set forth in claim 9, wherein the each cell mat of the plurality of cell mats has a sub-hole.

11. The semiconductor memory device as set forth in claim 10, wherein the input/output line switch is formed in the sub-hole.

12. The semiconductor memory device as set forth in claim 9, wherein the input/output line switch maintains a previous state in response to an output of the input/output line control circuit when another cell block is selected is the same as a previously accessed cell block.

13. The semiconductor memory device as set forth in claim 9, wherein the input/output line switch maintains the previous state in response to an output of the input/output line control circuit when another cell block is selected which is adjacent to a previously accessed cell block.

14. The semiconductor memory device as set forth in claim 9, wherein the input/output line switch is driven at a disable state in response to an output of the input/output line control circuit when another cell block is selected which is located more than two cell blocks away from a previously accessed cell block.

15. An input/output line control circuit, comprising:
a block address input unit which receives a first cell block address of a first cell block and a second cell block address of a second cell block adjacent to the first cell block;
a decoding unit which decodes an active command and an output signal of the block address input unit;
a driving unit which drives an output of the decoding unit;
a latch unit which latches an output signal of the decoding unit; and
an output unit which receives an output of the latch unit to generate an input/output control signal.

16. The input/output line control circuit as set forth in claim 15, wherein the input/output line control circuit controls a drive of an input/output line switch which connects a plurality of cell blocks including a plurality of cell mats.

17. The input/output line control circuit as set forth in claim 16, wherein the input/output line switch maintains the previous state in response to an output of the input/output line control circuit when another cell block is selected which is the same as a previously accessed cell block.

18. The input/output line control circuit as set forth in claim 17, wherein the previous state is a state that a toggle of the input/output line switch does not occurs.

19. The input/output line control circuit as set forth in claim 16, wherein the input/output line switch maintains the previous state in response to an output of the input/output line control circuit when another cell block is selected which is adjacent to a previously accessed block.

20. The input/output line control circuit as set forth in claim 16, wherein the input/output line switch is driven at a disable state in response to an output of the input/output line control circuit when another cell block is selected which is located more than two cell blocks away from a previously accessed cell block.

21. An input/output line control method, comprising:
a block address input process of receiving a first cell block address and a second cell block address;
a decoding process of decoding each output signal of an active command and the block address input unit;
a driving process of driving the decoded signal;
a latch process of latching the driven signal; and
an output process of generating an input/output control signal as the latched signal,
wherein an output level of the input/output control signal maintains the previous state when another cell block is selected which is the same as a previously accessed block.

22. The input/output line control method as set forth in claim 21, wherein the input/output control signal controls a drive of an input/output line switch, wherein the input/output control signal is a means of connecting a plurality of cell mats.

23. The input/output line control method as set forth in claim 22, wherein a toggle of the input/output line switch does not occur in response to an output level of the input/output control signal when another cell block is selected which is the same as the previously accessed block.

24. The input/output line control method as set forth in claim 22, wherein the input/output line switch is arranged in a sub-hole region formed in an adjacent region of the plurality of cell mats.

25. An input/output line control method comprising:
a block address input process of receiving a first cell block address and a second cell block address;
an active command input process of receiving an active command;
a decoding process of decoding each output signal of the block address input unit and the active command input unit;
a latch process of latching the decoded output signal; and
an output process of generating an input/output control signal as the latched output signal,
wherein an output level of the input/output control signal maintains the previous state when another cell block is selected which is adjacent to a previously accessed cell block.

26. The input/output line control method as set forth in claim 25, wherein the input/output control signal controls a drive of an input/output line switch which is a means of connecting a plurality of cell mats.

27. The input/output line control method as set forth in claim 26, wherein a toggle of the input/output line switch does not occur in response to an output level of the input/output control signal when another cell block is selected which is the same as the previously accessed cell block.

28. The input/output line control method as set forth in claim 26, wherein the input/output line switch is arranged in a sub-hole region formed in an adjacent region of the plurality of cell mats.

29. An input/output line control method, comprising:
a block address input process of receiving a first cell block address and a second cell block address;
an active command input process of receiving an active command;
a decoding process of decoding each output signal of the block address input unit and the active command input unit;
a latch process of latching the decoded output signal; and
an output process of generating an input/output control signal as the latched output signal,
wherein an output level of the input/output control signal is disabled when another cell block is selected which is located more than two blocks away from a previously accessed cell block.

30. The input/output line control method as set forth in claim 29, wherein the input/output control signal is a signal that controls a drive of an input/output line switch which is a means of connecting a plurality of cell mats.

31. The input/output line control method as set forth in claim 30, wherein the input/output line switch is disabled in response to an output level of the input/output control signal when another cell block is selected which is the same as the previously accessed cell block.

32. The input/output line control method as set forth in claim 30, wherein the input/output line switch is arranged in a sub-hole region formed in an adjacent region of the plurality of cell mats.

* * * * *